(12) United States Patent
Orui et al.

(10) Patent No.: US 12,198,938 B2
(45) Date of Patent: Jan. 14, 2025

(54) ETCHING METHOD

(71) Applicant: Tokyo Electron Limited, Tokyo (JP)

(72) Inventors: Takatoshi Orui, Miyagi (JP); Ryutaro Suda, Miyagi (JP); Maju Tomura, Miyagi (JP); Yoshihide Kihara, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 32 days.

(21) Appl. No.: 17/517,723

(22) Filed: Nov. 3, 2021

(65) Prior Publication Data
US 2022/0148884 A1    May 12, 2022

(30) Foreign Application Priority Data

Nov. 12, 2020  (JP) .................. 2020-188671

(51) Int. Cl.
| | |
|---|---|
| *H01L 21/311* | (2006.01) |
| *H01J 37/32* | (2006.01) |
| *H01L 21/3065* | (2006.01) |

(52) U.S. Cl.
CPC .. *H01L 21/31116* (2013.01); *H01J 37/32449* (2013.01); *H01J 37/32724* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 2017/0133233 | A1* | 5/2017 | Sato ................. | H10N 50/10 |
| 2018/0233356 | A1* | 8/2018 | Han .................. | H01L 21/0217 |
| 2019/0206723 | A1* | 7/2019 | Tokashiki ......... | H01L 21/76843 |

FOREIGN PATENT DOCUMENTS

| | | |
|---|---|---|
| JP | 2014-17406 A | 1/2014 |
| JP | 2016-39309 A | 3/2016 |
| JP | 2020-115538 A | 7/2020 |
| WO | 2019/178030 * | 9/2019 |

* cited by examiner

*Primary Examiner* — Stephanie P Duclair
(74) *Attorney, Agent, or Firm* — XSENSUS LLP

(57) ABSTRACT

An etching method that is disclosed includes providing a substrate into a chamber. The substrate has a silicon-containing film including a silicon nitride film. The etching method includes generating plasma from a processing gas in the chamber to etch the silicon-containing film. The processing gas includes a fluorine-containing gas and a boron-containing gas. In the etching, a temperature of a substrate support supporting the substrate is set to a temperature of less than 0° C.

17 Claims, 12 Drawing Sheets

ETCHING METHOD

CROSS-REFERENCE TO RELATED APPLICATION

This application is based on and claims the benefit of priority from Japanese Patent Application No. 2020-188671 filed on Nov. 12, 2020, the entire contents of which are incorporated herein by reference.

FIELD

An exemplary embodiment of the present disclosure relates to an etching method.

BACKGROUND

In the manufacture of electronic devices, plasma etching of a silicon-containing film of a substrate is performed. In the plasma etching, the etching of the silicon-containing film is performed using plasma generated from a processing gas. Japanese Unexamined Patent Publication No. 2016-39309 discloses a processing gas that includes hydrogen gas, fluorohydrocarbon gas, fluorine-containing gas, hydrocarbon gas, boron trichloride gas, and nitrogen gas, as a processing gas that is used for plasma etching of a silicon-containing film. Japanese Unexamined Patent Publication No. 2014-17406 discloses a processing gas containing boron as a processing gas that is used for plasma etching of a silicon-containing film.

SUMMARY

In an exemplary embodiment, an etching method is provided. The etching method includes (a) providing a substrate having a silicon-containing film including a silicon nitride film in a chamber, and (b) generating plasma from a processing gas in the chamber to etch the silicon-containing film. The processing gas includes a fluorine-containing gas and a boron-containing gas. In the (b), a temperature of a substrate support supporting the substrate is set to a temperature of less than 0° C.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
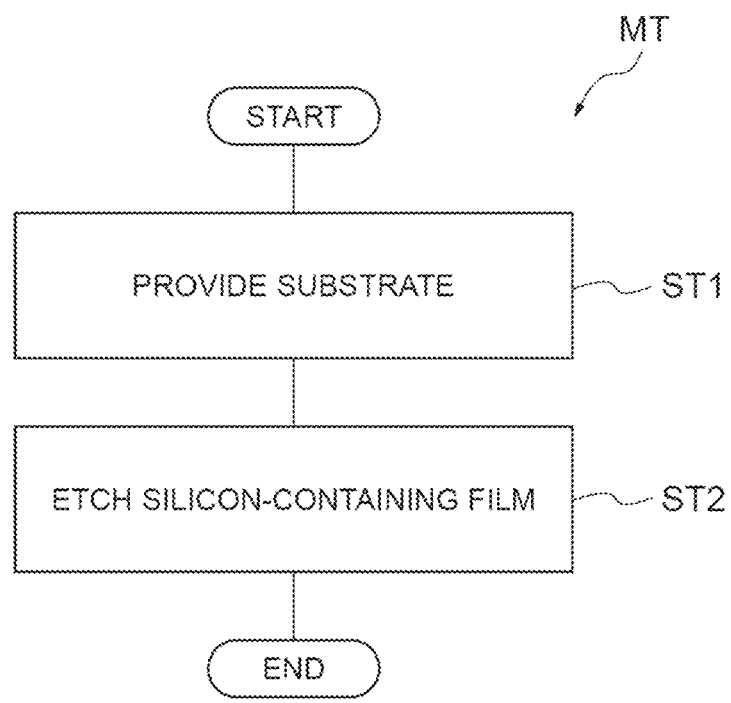
FIG. 1 is a flow chart of an etching method according to an exemplary embodiment.

Hereinafter, various exemplary embodiments will be described.

In an exemplary embodiment, an etching method is provided. The etching method includes (a) providing a substrate having a silicon-containing film including a silicon nitride film in a chamber, and (b) generating plasma from a processing gas in the chamber to etch the silicon-containing film. The processing gas includes a fluorine-containing gas and a boron-containing gas. In the (b), a temperature of a substrate support supporting the substrate is set to a temperature of less than 0° C.

According to the etching method, it is possible to reduce a defect of the shape of an opening that is formed in the silicon-containing film in the plasma etching of the silicon-containing film. The mechanism by which the defect of the shape of the opening is reduced is considered as follows. However, there is no limitation thereto. If the temperature of the substrate support is low (for example, less than 0° C.), a by-product (for example, diammonium hexafluorosilicate $((NH_4)_2SiF_6)$) that is produced by etching becomes difficult to volatilize. As a result, the by-products accumulate on the side wall or bottom of the opening during the etching, so that the etching is prevented from proceeding linearly in a depth direction. In this way, the side wall of the opening is bent, so that the defect of the shape of the opening may occur. However, if the boron-containing gas is included in the processing gas, the production of the by-product is prevented and the decomposition of the by-product is promoted. Therefore, the defect of the shape of the opening due to the by-products is reduced.

In an exemplary embodiment, the processing gas may further include a phosphorus-containing gas. If the phosphorus-containing gas is included in the processing gas, the production of the by-product that is produced by etching is promoted. Even in such a case, if the boron-containing gas is included in the processing gas, the production of the by-product is prevented and the decomposition of the by-product is promoted.

The fluorine-containing gas may include at least one of fluorocarbon gas, hydrofluorocarbon gas, hydrogen fluoride gas, nitrogen trifluoride gas, and sulfur hexafluoride gas. In this case, it is possible to further reduce the defect of the shape of the opening that is formed in the silicon-containing film.

The proportion of the flow rate of the boron-containing gas to the flow rate of the processing gas may be 6% or less. In this case, the flow rate of the boron-containing gas can be reduced.

The silicon-containing film may further include a silicon oxide film.

In another exemplary embodiment, an etching method is provided. The etching method includes (a) providing a substrate having a silicon-containing film including a silicon nitride film in a chamber, and (b) generating plasma from a processing gas in the chamber to etch the silicon-containing film. The processing gas includes a phosphorus-containing gas, a fluorine-containing gas, and a boron-containing gas.

According to the etching method, it is possible to reduce a defect of the shape of an opening that is formed in the silicon-containing film in the plasma etching of the silicon-containing film. The mechanism by which the defect of the shape of the opening is reduced is considered as follows. However, there is no limitation thereto. If the phosphorus-containing gas is included in the processing gas, the production of the by-product (for example, diammonium hexafluorosilicate (($NH_4)_2SiF_6$)) that is produced by etching is promoted. As a result, the by-products accumulate on the side wall or bottom of the opening during the etching, so that the etching is prevented from proceeding linearly in a depth direction. In this way, the side wall of the opening is bent, so that the defect of the shape of the opening may occur. However, if the boron-containing gas is included in the processing gas, the production of the by-product is prevented and the decomposition of the by-product is promoted. Therefore, the defect of the shape of the opening due to the by-products is reduced.

In the (b), a temperature of a substrate support supporting the substrate may be set to a temperature of less than 0° C. If the temperature of the substrate support is low (for example, less than 0° C.), the by-product that is produced by etching becomes difficult to volatilize. Even in such a case, if the boron-containing gas is included in the processing gas, the production of the by-product is prevented and the decomposition of the by-product is promoted.

The proportion of the flow rate of the boron-containing gas to the flow rate of the processing gas may be 6% or less. In this case, the flow rate of the boron-containing gas can be reduced.

The silicon-containing film may further include a silicon oxide film.

Hereinafter, various exemplary embodiments will be described in detail with reference to the drawings. In each drawing, identical or corresponding parts are denoted by the same reference symbols.

FIG. 1 is a flow chart of an etching method according to an exemplary embodiment. The etching method (hereinafter referred to as a "method MT") shown in FIG. 1 is applied to a substrate having a silicon-containing film. In the method MT, the silicon-containing film is etched.

Figure 2:
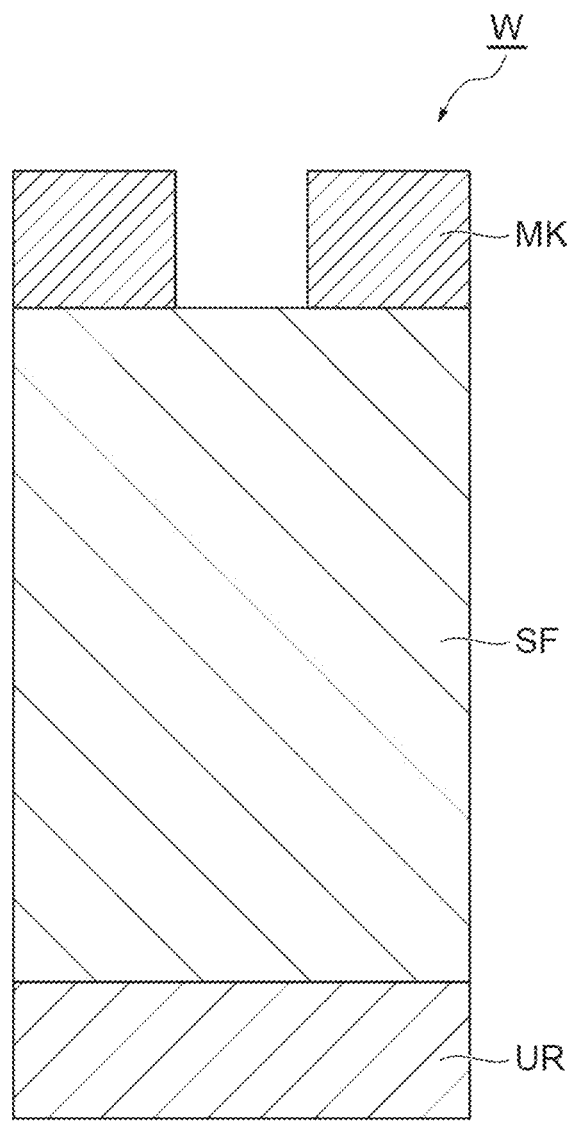
FIG. 2 is a partially enlarged sectional view of a substrate of an example to which the etching method shown in FIG. 1 can be applied.

FIG. 2 is a partially enlarged sectional view of a substrate of an example to which the etching method shown in FIG. 1 can be applied. A substrate W shown in FIG. 2 can be used in the manufacture of devices such as a DRAM and a 3D-NAND. The substrate W has a silicon-containing film SF. The substrate W may further have an underlying region UR. The silicon-containing film SF may be provided on the underlying region UR.

The silicon-containing film SF may be a silicon-containing dielectric film. The silicon-containing dielectric film may include a silicon oxide film or a silicon nitride film. The silicon-containing dielectric film may be a film having another film type as long as it is a dielectric film containing silicon. Further, the silicon-containing film SF may include a silicon film (for example, a polycrystalline silicon film). Further, the silicon-containing film SF may include at least one of a silicon nitride film, a polycrystalline silicon film, a carbon-containing silicon film, and a low dielectric constant film. The carbon-containing silicon film may include a SiC film and/or a SiOC film. The low dielectric constant film contains silicon and may be used as an interlayer insulating film. Further, the silicon-containing film SF may include two or more silicon-containing films having different film types from each other. The two or more silicon-containing films may include a silicon oxide film and a silicon nitride film. The silicon-containing film SF may be, for example, a multilayer film that includes one or more silicon oxide films and one or more silicon nitride films laminated alternately. The silicon-containing film SF may be a multilayer film that includes a plurality of silicon oxide films and a plurality of silicon nitride films laminated alternately. Alternatively, the two or more silicon-containing films may include a silicon oxide film and a silicon film. The silicon-containing film SF may be, for example, a multilayer film that includes one or more silicon oxide films and one or more silicon films laminated alternately. The silicon-containing film SF may be a multilayer film that includes a plurality of silicon oxide films and a plurality of polycrystalline silicon films laminated alternately. Alternatively, the two or more silicon-containing films may include a silicon oxide film, a silicon nitride film, and a silicon film.

The substrate W may further have a mask MK. The mask MK is provided on the silicon-containing film SF. The mask MK is formed of a material having an etching rate lower than the etching rate of the silicon-containing film SF in step ST2. The mask MK may be formed of an organic material. That is, the mask MK may contain carbon. The mask MK may be formed of, for example, an amorphous carbon film, a photoresist film, or a spin-on carbon film (SOC film). Alternatively, the mask MK may be formed of a silicon-containing film such as a silicon-containing antireflection film. Alternatively, the mask MK may be a metal-containing mask formed of a metal-containing material such as titanium nitride, tungsten, or tungsten carbide. The mask MK may have a thickness of 3 μm or larger.

The mask MK is patterned. That is, the mask MK has a pattern that is transferred to the silicon-containing film SF in step ST2. If the pattern of the mask MK is transferred to the silicon-containing film SF, an opening OP (refer to FIG. 4) such as a hole or a trench is formed in the silicon-containing film SF. The opening OP may be a recessed portion. The opening OP may penetrate the silicon-containing film SF in a thickness direction. In a case where the silicon-containing film SF is a multilayer film that includes a plurality of silicon oxide films and a plurality of silicon nitride films laminated alternately, the opening OP may penetrate the multilayer film in the thickness direction. The aspect ratio of the opening OP that is formed in the silicon-containing film SF in step ST2 may be 20 or more, or may be 30 or more, 40 or more, or 50 or more. The mask MK may have a line-and-space pattern.

Figure 3:
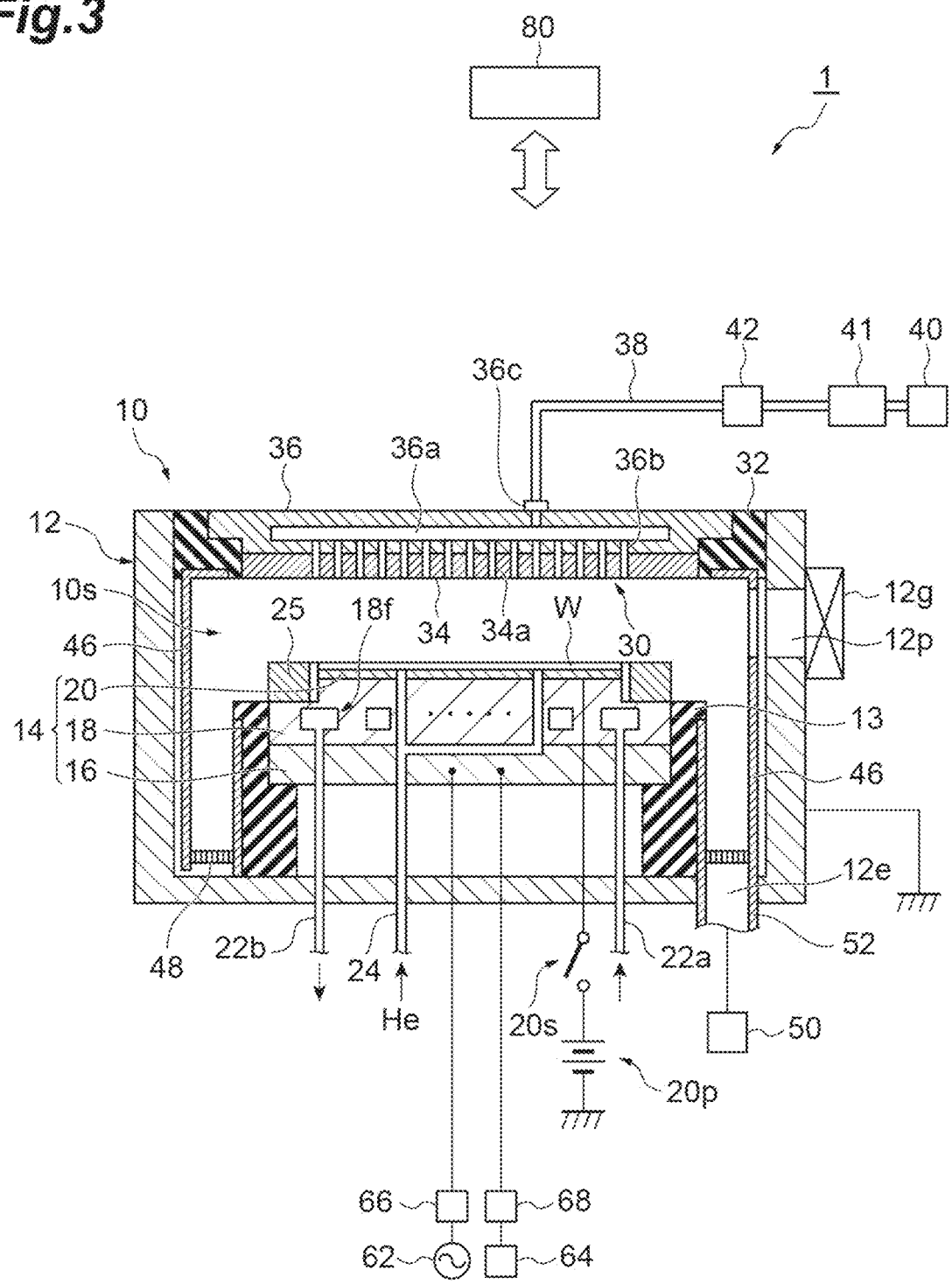
FIG. 3 schematically illustrates a plasma processing apparatus according to an exemplary embodiment.

In the method MT, a plasma processing apparatus is used for the etching of the silicon-containing film SF. FIG. 3 is a diagram schematically showing a plasma processing apparatus according to an exemplary embodiment. A plasma processing apparatus 1 shown in FIG. 3 is provided with a chamber 10. The chamber 10 provides an internal space 10s therein. The chamber 10 includes a chamber body 12. The chamber body 12 has a substantially cylindrical shape. The chamber body 12 is formed of, for example, aluminum. A film having corrosion resistance is provided on the inner wall surface of the chamber body 12. The film having corrosion resistance may be formed of ceramic such as aluminum oxide or yttrium oxide.

A passage 12p is formed in the side wall of the chamber body 12. The substrate W is transferred between the internal space 10s and the outside of the chamber 10 through the passage 12p. The passage 12p is opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the internal space 10s.

The substrate support 14 has a lower electrode 18 and an electrostatic chuck 20. The substrate support 14 may further include an electrode plate 16. The electrode plate 16 is formed of a conductor such as aluminum and has a substantially disk shape. The lower electrode 18 is provided on the electrode plate 16. The lower electrode 18 is formed of a conductor such as aluminum and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 has a substantially disk shape and is formed of a dielectric. The electrode of the electrostatic chuck 20 is a film-like electrode, and is provided in the main body of the electrostatic chuck 20. The electrode of the electrostatic chuck 20 is connected to a direct-current power source 20p through a switch 20s. If the voltage from the direct-current power source 20p is applied to the electrode of the electrostatic chuck 20, an electrostatic attraction force is generated between the electrostatic chuck 20 and the substrate W. The substrate W is attracted to the electrostatic chuck 20 by the electrostatic attraction force and held by the electrostatic chuck 20.

An edge ring 25 is disposed on the substrate support 14. The edge ring 25 is a ring-shaped member. The edge ring 25 may be formed of silicon, silicon carbide, quartz, or the like. The substrate W is disposed on the electrostatic chuck 20 and in a region surrounded by the edge ring 25.

A flow path 18f is provided in the interior of the lower electrode 18. A heat exchange medium (for example, a refrigerant) is supplied from a chiller unit provided outside the chamber 10 to the flow path 18f through a pipe 22a. The heat exchange medium supplied to the flow path 18f is returned to the chiller unit through a pipe 22b. In the plasma processing apparatus 1, the temperature of the substrate W placed on the electrostatic chuck 20 is adjusted by heat exchange between the heat exchange medium and the lower electrode 18.

The plasma processing apparatus 1 is provided with a gas supply line 24. The gas supply line 24 supplies a heat transfer gas (for example, a He gas) from a heat transfer gas supply mechanism to a gap between the upper surface of the electrostatic chuck 20 and the rear surface of the substrate W.

The plasma processing apparatus 1 is further provided with an upper electrode 30. The upper electrode 30 is provided above the substrate support 14. The upper electrode 30 is supported on an upper portion of the chamber body 12 through a member 32. The member 32 is formed of an insulating material. The upper electrode 30 and the member 32 close the upper opening of the chamber body 12.

The upper electrode 30 may include a ceiling plate 34 and a support 36. The lower surface of the ceiling plate 34 is a lower surface facing the internal space 10s and defines the internal space 10s. The ceiling plate 34 may be formed of a low resistance conductor or semiconductor in which Joule heat that is generated is small. The ceiling plate 34 has a plurality of gas discharge holes 34a that penetrate the ceiling plate 34 in the thickness direction thereof.

The support 36 detachably supports the ceiling plate 34. The support 36 is formed of a conductive material such as aluminum. A gas diffusion chamber 36a is provided in the interior of the support 36. The support 36 has a plurality of gas holes 36b extending downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a flow rate controller group 41 and a valve group 42. The flow rate controller group 41 and the valve group 42 configure a gas supply unit. The gas supply unit may further include the gas source group 40. The gas source group 40 includes a plurality of gas sources. The plurality of gas sources include sources of the processing gases that are used in the method MT. The flow rate controller group 41 includes a plurality of flow rate controllers. Each of the plurality of flow rate controllers of the flow rate controller group 41 is a mass flow controller or a pressure control type flow rate controller. The valve group 42 includes a plurality of on-off valves. Each of the plurality of gas sources of the gas source group 40 is connected to the gas supply pipe 38 through a corresponding flow rate controller of the flow rate controller group 41 and a corresponding on-off valve of the valve group 42.

In the plasma processing apparatus 1, a shield 46 is detachably provided along the inner wall surface of the chamber body 12 and the outer periphery of the support 13. The shield 46 prevents reaction by-products from adhering to the chamber body 12. The shield 46 is configured by forming a film having corrosion resistance on the surface of a base material formed of aluminum, for example. The film having corrosion resistance may be formed of ceramic such as yttrium oxide.

A baffle plate 48 is provided between the support 13 and the side wall of the chamber body 12. The baffle plate 48 is configured by forming a film having corrosion resistance (a film of yttrium oxide or the like) on the surface of a member formed of aluminum, for example. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 includes a pressure control valve and a vacuum pump such as a turbo molecular pump.

The plasma processing apparatus 1 is further provided with a radio frequency power source 62 and a bias power source 64. The radio frequency power source 62 is a power source that generates radio frequency power HF. The radio frequency power HF has a first frequency suitable for the generation of plasma. The first frequency is, for example, a frequency in the range of 27 MHz to 100 MHz. The radio frequency power source 62 is connected to the lower electrode 18 through a matcher 66 and the electrode plate 16. The matcher 66 has a circuit for matching the impedance on the load side (the lower electrode 18 side) of the radio frequency power source 62 with the output impedance of the radio frequency power source 62. The radio frequency power source 62 may be connected to the upper electrode 30 through the matcher 66. The radio frequency power source 62 configures a plasma generation unit of an example.

The bias power source 64 is a power source that generates an electric bias. The bias power source 64 is electrically connected to the lower electrode 18. The electric bias has a second frequency. The second frequency is lower than the first frequency. The second frequency is, for example, a frequency in the range of 400 kHz to 13.56 MHz. In a case where the electric bias is used together with the radio frequency power HF, the electric bias is given to the lower electrode 18 in order to draw ions into the substrate W. If the electric bias is given to the lower electrode 18, the potential of the substrate W placed on the substrate support 14 fluctuates within a cycle that is defined at the second frequency.

In an exemplary embodiment, the electric bias may be radio frequency power LF having the second frequency. In a case where the radio frequency power LF is used together with the radio frequency power HF, the radio frequency power LF is used as radio frequency bias power for drawing ions into the substrate W. The bias power source 64 configured to generate the radio frequency power LF is connected to the lower electrode 18 through a matcher 68 and the electrode plate 16. The matcher 68 has a circuit for matching the impedance on the load side (the lower electrode 18 side) of the bias power source 64 with the output impedance of the bias power source 64.

Plasma may be generated by using the radio frequency power LF without using the radio frequency power HF, that is, by using only single radio frequency power. In this case, the frequency of the radio frequency power LF may be a frequency larger than 13.56 MHz, for example, 40 MHz. Further, in this case, the plasma processing apparatus 1 does not need to be provided with the radio frequency power source 62 and the matcher 66. In this case, the bias power source 64 configures the plasma generation unit of an example.

In a case where plasma processing is performed in the plasma processing apparatus 1, gas is supplied from the gas supply unit to the internal space 10s. Further, the radio frequency power HF and/or the electric bias is supplied, whereby a radio frequency electric field is generated between the upper electrode 30 and the lower electrode 18. The generated radio frequency electric field generates plasma from the gas in the internal space 10s.

The plasma processing apparatus 1 may be further provided with a controller 80. The controller 80 may be a computer which includes a processor, a storage unit such as a memory, an input device, a display device, a signal input/output interface, and the like. The controller 80 controls each part of the plasma processing apparatus 1. According to the controller 80, an operator can perform a command input operation or the like by using the input device in order to manage the plasma processing apparatus 1. Further, in the controller 80, the operating status of the plasma processing apparatus 1 can be visualized and displayed by the display device. Further, a control program and recipe data are stored in the storage unit. The control program is executed by the processor in order to execute various processing in the plasma processing apparatus 1. The processor executes the control program and controls each part of the plasma processing apparatus 1 according to the recipe data.

FIG. 1 will be referred to again. Hereinafter, the method MT will be described by taking a case where it is applied to the substrate W shown in FIG. 2 by using the plasma processing apparatus 1 as an example. In a case where the plasma processing apparatus 1 is used, the method MT can be executed in the plasma processing apparatus 1 under the control of each part of the plasma processing apparatus 1 by the controller 80. In the following description, the control of each part of the plasma processing apparatus 1 by the controller 80 for the execution of the method MT will also be described.

Figure 4:
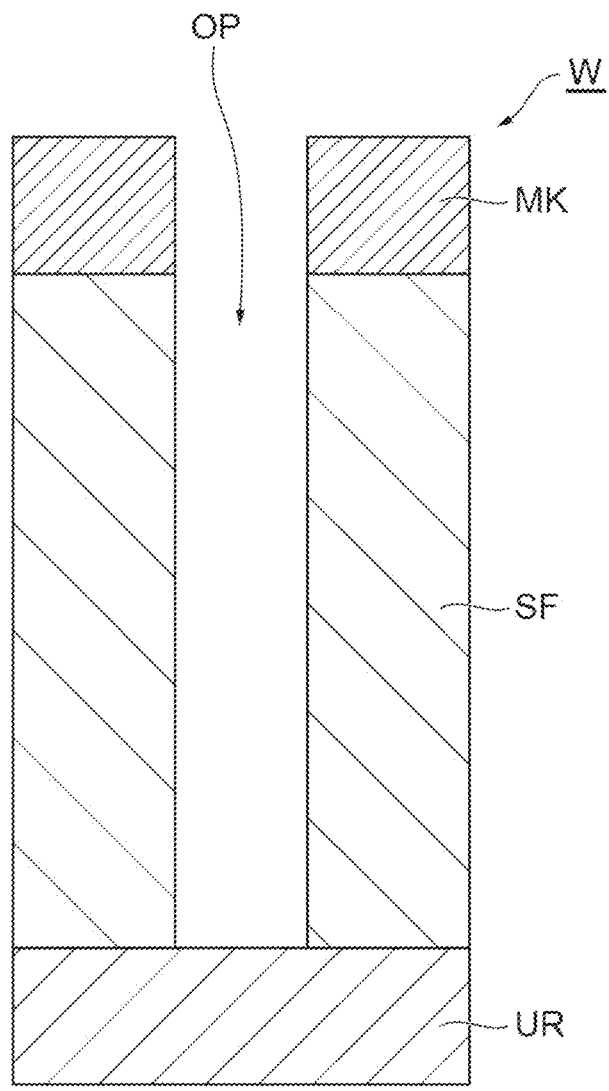
FIG. 4 is a partially enlarged sectional view of a substrate of an example to which the etching method shown in FIG. 1 is applied.

In the following description, in addition to FIG. 1, FIG. 4 will be referred to. FIG. 4 is a partially enlarged sectional view of a substrate of an example to which the etching method shown in FIG. 1 is applied.

As shown in FIG. 1, the method MT starts in step ST1. In step ST1, the substrate W is provided into the chamber 10. The substrate W is placed on the electrostatic chuck 20 in the chamber 10 and held by the electrostatic chuck 20. The substrate W may have a diameter of 300 mm.

In the method MT, subsequently, step ST2 is executed. In step ST2, the silicon-containing film SF is etched by a chemical species from the plasma generated from the processing gas in the chamber 10. The chemical species may be a halogen chemical species.

In an exemplary embodiment, the processing gas that is used in step ST2 includes a fluorine-containing gas and a boron-containing gas. The processing gas may further include a phosphorus-containing gas. The processing gas may further include a halogen-containing gas. The halogen-containing gas contains, for example, chlorine ($Cl_2$) gas. The processing gas may further include a carbon-containing gas. The processing gas may further include an inert gas. The inert gas contains, for example, a noble gas. The processing gas may further include an oxygen-containing gas. The oxygen-containing gas contains, for example, $O_2$.

The fluorine-containing gas may include at least one of hydrofluorocarbon ($C_sH_tF_u$) gas, fluorocarbon ($C_vF_w$) gas, hydrogen fluoride (HF) gas, nitrogen trifluoride ($NF_3$) gas, and sulfur hexafluoride ($SF_6$) gas. Here, each of s, t, u, v, and w is a natural number. Hydrofluorocarbon is, for example, at least one of $CH_2F_2$, $CHF_3$, $CH_3F$, $C_2HF_5$, $C_3H_2F_4$, and the like. The hydrofluorocarbon may be a hydrofluorocarbon containing two or more carbon atoms. Fluorocarbon is, for example, at least one of $CF_4$, $C_2F_6$, $C_3F_6$, $C_3F_8$, $C_4F_6$, $C_4F_8$, $C_5F_8$, and the like. The fluorocarbons and the hydrofluorocarbons contain carbon atoms and serve to protect the mask.

The phosphorus-containing gas may be a gas containing a phosphorus atom and a halogen atom, or may be a gas containing a phosphorus atom and a fluorine atom. Examples of gases containing a phosphorus atom and a halogen atom include phosphorus trifluoride ($PF_3$), phosphorus pentafluoride ($PF_5$), phosphorus trichloride ($PCl_3$), phosphorus pentachloride ($PCl_5$), and phosphoryl chloride ($POCl_3$). Examples of gases containing a phosphorus atom and a fluorine atom include phosphorus trifluoride ($PF_3$) and phosphorus pentafluoride ($PF_5$). In a state where a phosphorus chemical species that is generated from the phosphorus-containing gas is present on the surface of the substrate W, the adsorption of an etchant to the substrate W is promoted. That is, in a state where the phosphorus chemical species that is generated from the phosphorus-containing gas is present on the surface of the substrate W, the supply of the etchant to the bottom of the opening (recessed portion) is promoted, and thus the etching rate of the silicon-containing film SF is increased.

The carbon-containing gas may include hydrocarbon ($C_xH_y$) gas. Here, each of x and y is a natural number. Hydrocarbon is, for example, at least one of $CH_4$, $C_3H_6$, and the like. In a case where the carbon-containing gas containing two or more carbon atoms is used, the effect of protecting the side wall surface defining the opening in the mask MK and the silicon-containing film SF can be further increased.

The boron-containing gas may include boron trichloride ($BCl_3$) gas. The proportion of the flow rate of the boron-containing gas to the flow rate of the processing gas is larger than 0% and may be 0.5% or more, or 1% or more. The proportion may be 6% or less, 3% or less, or 2% or less. If the proportion of the flow rate of the boron-containing gas is reduced, the etching rate of the silicon oxide film can be increased and the amount of the mask MK that is etched by the boron-containing gas can be reduced.

For the execution of step ST2, the controller 80 controls the gas supply unit to supply the processing gas into the chamber 10. The controller 80 controls the exhaust device 50 to set the pressure of the gas in the chamber 10 to a designated pressure. The controller 80 controls the chiller unit to set the temperature of the substrate support 14 to a designated temperature. The controller 80 controls the plasma generation unit to generate plasma from the processing gas.

In an exemplary embodiment, the temperature of the substrate support 14 in step ST2 may be set to a temperature of less than 0° C., less than −20° C., less than −30° C., or −40° C. or lower, or may be set to a temperature of −170° C. or higher. If the temperature of the substrate W is set to a temperature of less than −30° C., the etching rate of the silicon-containing film SF in step ST2 is increased.

According to the method MT described above, in the plasma etching of the silicon-containing film SF, it is possible to reduce the defect (twist or torsion) of the shape of the opening OP that is formed in the silicon-containing film SF. The mechanism by which the defect of the shape of the opening OP is reduced is considered as follows. However, there is no limitation thereto.

If the temperature of the substrate support 14 is low (for example, less than 0° C.), a by-product (for example, diammonium hexafluorosilicate (($NH_4)_2SiF_6$)) that is produced by etching becomes difficult to volatilize. Alternatively, if the phosphorus-containing gas is included in the processing gas, the production of the by-product (for example, diammonium hexafluorosilicate (($NH_4)_2SiF_6$)) that is produced by etching is promoted. As a result, the by-products accumulate on the side wall or bottom of the opening during the etching, so that the etching is prevented from proceeding linearly in a depth direction. In this way, the side wall of the opening is bent, so that the defect of the shape of the opening may occur. However, if the boron-containing gas is included in the processing gas, the production of the by-product is prevented and the decomposition of the by-product is promoted. Therefore, the defect of the shape of the opening due to the by-products is reduced.

The mechanism by which the boron-containing gas prevents the production of the by-product is considered as follows. However, there is no limitation thereto. The boron-containing gas has a function of scavenging fluorine atoms. As a result, the reaction for producing diammonium hexafluorosilicate as a by-product does not proceed, so that the production of the by-products is prevented.

The mechanism by which the boron-containing gas promotes the decomposition of the by-product is considered as follows. However, there is no limitation thereto. The boron-containing gas lowers the activation energy of the decomposition reaction of the by-product, so that the decomposition of the by-product is promoted.

The mechanism by which the phosphorus-containing gas promotes the production of the by-product is considered as follows. However, there is no limitation thereto. Excess $NH_3$ remains on the side wall or bottom of the opening due to the reaction of SiN with the phosphorus-containing gas. As a result, diammonium hexafluorosilicate is produced by the reaction of SiN, $NH_3$, and a fluorine-containing gas.

Various exemplary embodiments have been described above. However, various additions, omissions, substitutions, and changes may be made without being limited to the exemplary embodiments described above. Further, it is possible to combine elements in different exemplary embodiments to form other exemplary embodiments.

For example, the plasma processing apparatus that is used in the method MT may be a capacitively coupled plasma processing apparatus other than the plasma processing apparatus 1. Alternatively, the plasma processing apparatus that is used in the method MT may be a plasma processing apparatus of a type other than the capacitively coupled type. Such a plasma processing apparatus may be an inductively coupled plasma processing apparatus, an ECR (electron cyclotron resonance) plasma processing apparatus, or a plasma processing apparatus that generates plasma using surface waves such as microwaves, or the like.

Further, the plasma processing apparatus may be provided with another bias power source configured to intermittently or periodically apply a pulse of a negative direct-current voltage to the lower electrode 18, in addition to the bias power source 64 that supplies the radio frequency power LF to the lower electrode 18.

Hereinafter, various experiments performed for the evaluation of the method MT will be described. The experiments described below do not limit the present disclosure.

(First to Fourth Experiments)

Figure 5:
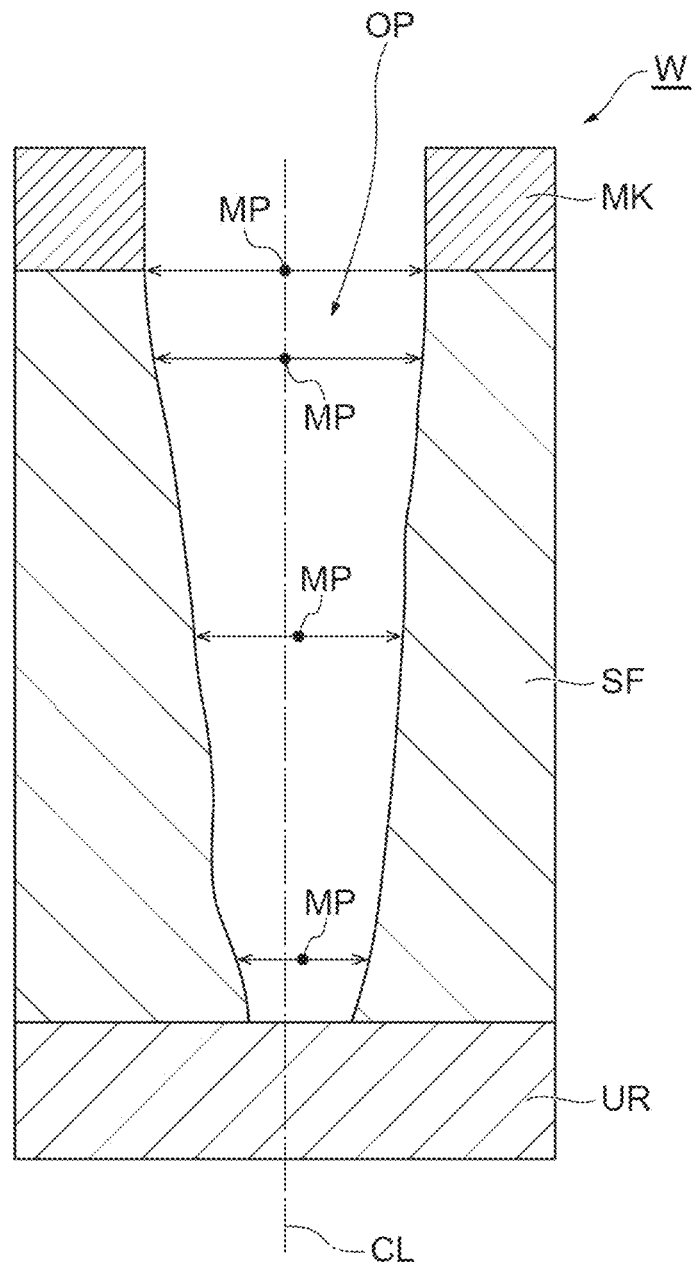
FIG. 5 is a partially enlarged sectional view of a substrate of an example for evaluating the degree of a defect of the shape of an opening.

FIG. 5 is a partially enlarged sectional view of a substrate of an example for evaluating the degree of the defect of the shape of the opening. The opening (recessed portion) OP is formed in the silicon-containing film SF of the substrate W shown in FIG. 5. A center reference line CL of the opening OP passes through a middle point MP of the width of the opening OP at the upper end of the opening OP. By measuring the amount of deviation of the middle point MP from the center reference line CL along the depth direction of the opening OP, it is possible to evaluate the degree of the defect (twist or torsion) of the shape of the opening OP.

In the first to fourth experiments, a plurality of sample substrates having the same structure as the substrate W shown in FIG. 2 were prepared. Each of the plurality of sample substrates had a silicon-containing film and a mask provided on the silicon-containing film. The silicon-containing film was a multilayer film having a plurality of silicon oxide films and a plurality of silicon nitride films laminated alternately. The thickness of each silicon nitride film and the thickness of each silicon oxide film were about several tens of nm. The mask was a mask formed of an amorphous carbon film. In each of the first to fourth experiments, the silicon-containing film of the sample substrate was etched by generating plasma from the processing gas by using a plasma processing apparatus having the same structure as the plasma processing apparatus 1 in FIG. 3.

The processing gas used in the first experiment included 38% $H_2$ gas, 11% halogen-containing gas, 20% $C_vF_w$ gas, and 31% $O_2$ gas. The processing gas used in the second experiment included 35% $H_2$ gas, 10% halogen-containing gas, 18% $C_vF_w$ gas, 29% $O_2$ gas, and 8% $PF_3$ gas. Each percentage indicates the proportion of the flow rate (unit: sccm) of each gas to the flow rate (unit: sccm) of the processing gas. In the first and second experiments, the temperature of the substrate support 14 was −40° C. The processing gas used in the third experiment was the same as the processing gas in the first experiment. The processing gas used in the fourth experiment was the same as the processing gas in the second experiment. In the third and fourth experiments, the temperature of the substrate support 14 was −70° C. Other condition for each of the first to fourth experiments is shown below.

<Other Condition for Each of First to Fourth Experiments>

Pressure of Gas in the Chamber 10: 20 mTorr (2.7 Pa)

Figure 6:
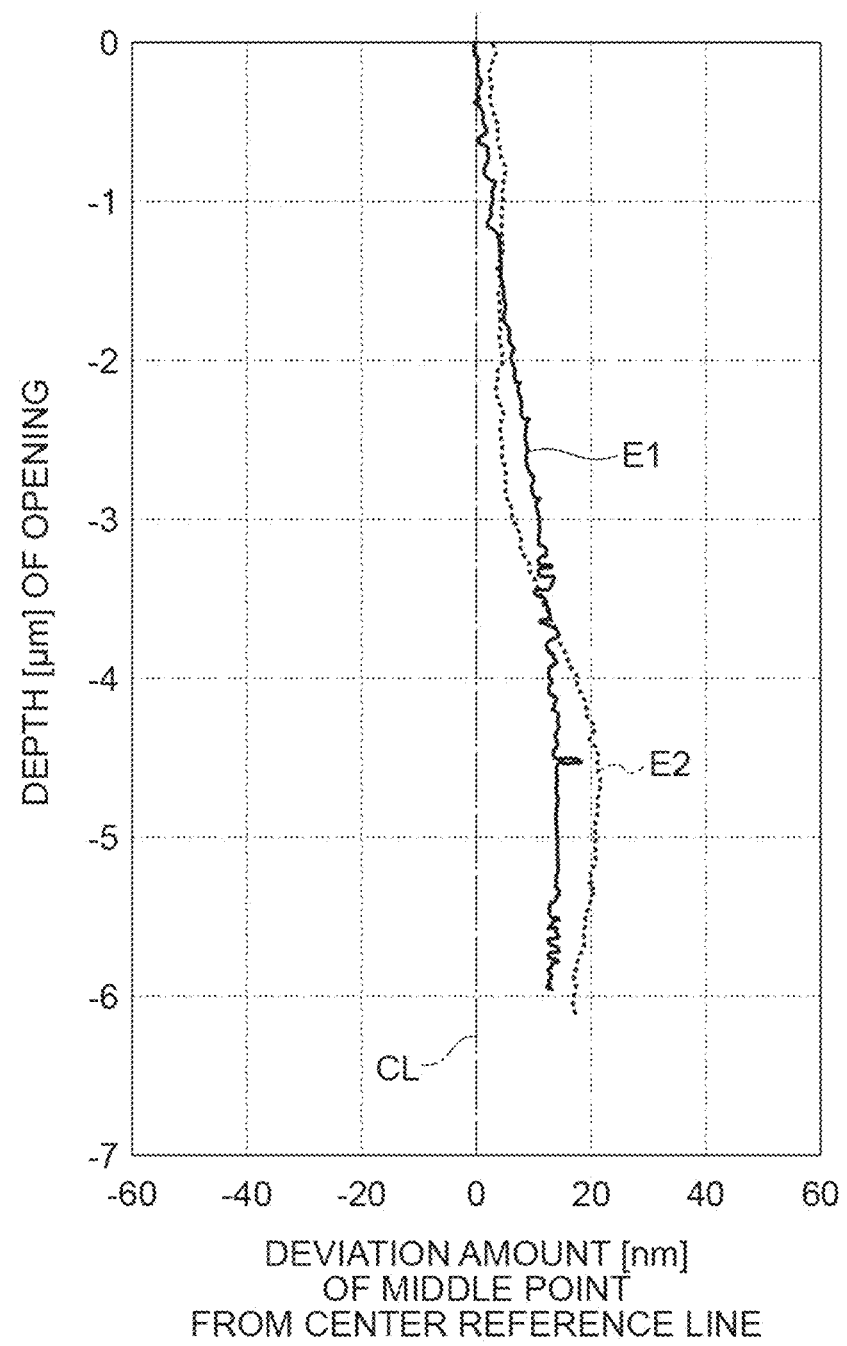
FIG. 6 is a graph showing the results of first and second exemplary experiments.
Figure 7:
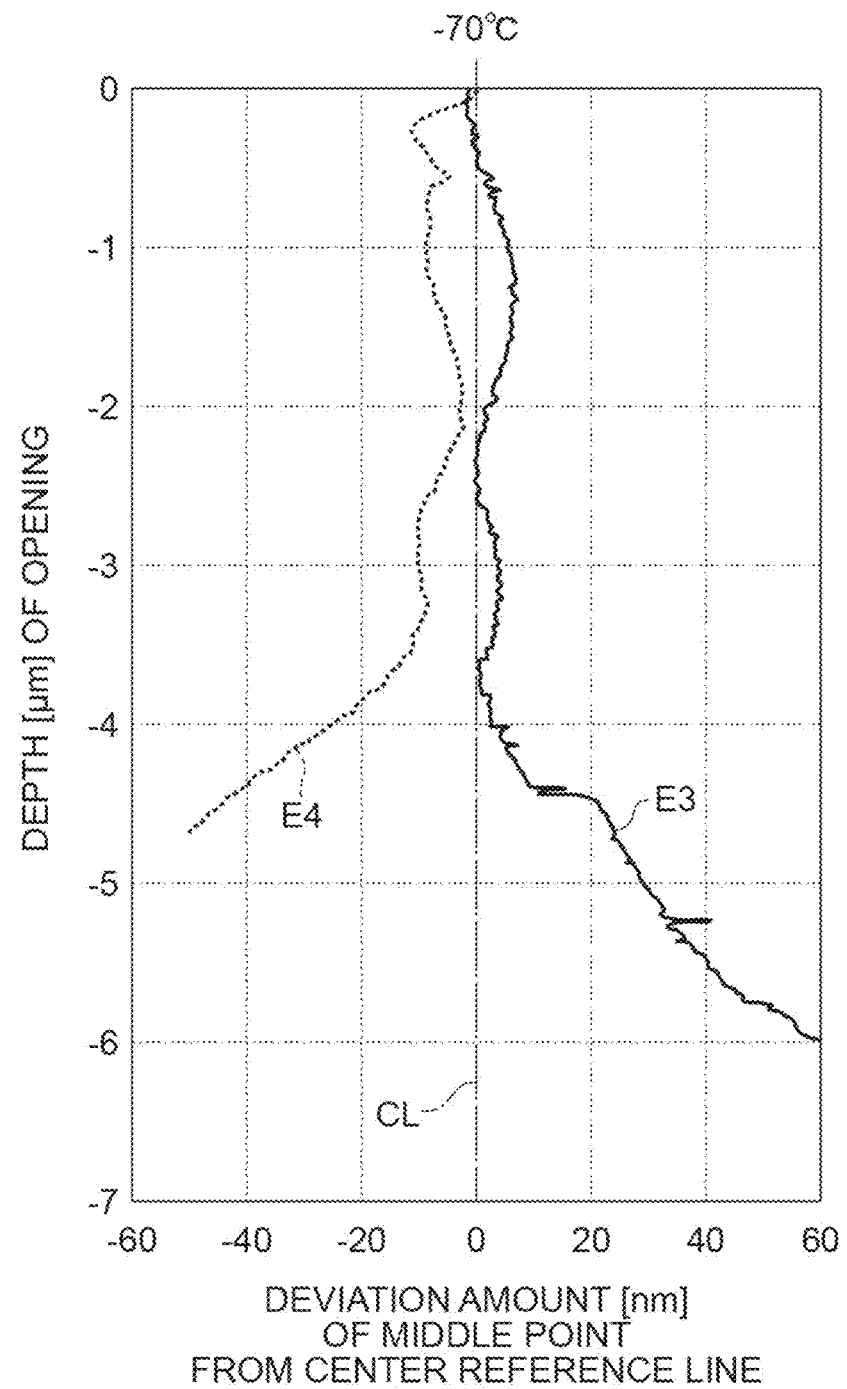
FIG. 7 is a graph showing the results of third and fourth exemplary experiments.

In each of the first to fourth experiments, after the etching of the silicon-containing film, the amount of deviation of the middle point MP of the width of the opening OP from the center reference line CL was determined as shown in FIG. 5. The results are shown in FIGS. 6 and 7. FIG. 6 is a graph showing the results of the first and second experiments. FIG. 7 is a graph showing the results of the third and fourth experiments. As shown in FIG. 6, the maximum deviation amount (22 nm) of a profile E2 indicating the amount of deviation of the middle point MP in the second experiment was larger than the maximum deviation amount (14 nm) of a profile E1 indicating the amount of deviation of the middle point MP in the first experiment. Therefore, it was found that when the phosphorus-containing gas was included in the processing gas, the degree of the defect of the shape of the opening OP could deteriorate.

Further, as shown in FIGS. 6 and 7, the maximum deviation amount (58 nm) of a profile E3 indicating the amount of deviation of the middle point MP in the third experiment was larger than the maximum deviation amount (14 nm) of the profile E1 indicating the amount of deviation of the middle point MP in the first experiment. The maximum deviation amount (50 nm) of a profile E4 indicating the amount of deviation of the middle point MP in the fourth experiment was larger than the maximum deviation amount (22 nm) of the profile E2 indicating the amount of deviation of the middle point MP in the second experiment. Therefore, it was found that when the temperature of the substrate support 14 became low, the degree of the defect of the shape of the opening OP deteriorated.

(Fifth to Thirteenth Experiments)

In the fifth to thirteenth experiments, the same sample substrates as the sample substrates prepared in the first to fourth experiments were prepared. In each of the fifth to thirteenth experiments, the silicon-containing film of the sample substrate was etched by generating plasma from the processing gas by using the plasma processing apparatus 1. The processing gas used in the fifth experiment included 96% fluorine-containing gas, 1% $C_4F_8$, and 3% $PF_3$ gas. The processing gas used in the sixth experiment included 91% fluorine-containing gas, 1% $C_4F_8$, 2% $PF_3$ gas, and 6% $BCl_3$. The processing gas used in the seventh experiment included 92% fluorine-containing gas, 1% $C_4F_8$, 2% $PF_3$ gas, and 5% $SiCl_4$. The processing gas used in the eighth experiment included 88% fluorine-containing gas, 1% $C_4F_8$, 2% $PF_3$ gas, and 9% $Cl_2$. The processing gas used in the ninth experiment included 90% fluorine-containing gas, 2% $C_4F_8$, 2% $PF_3$ gas, and 6% $BCl_3$. The processing gas used in the tenth experiment included 92% fluorine-containing gas, 1% $C_4F_8$, 2% $PF_3$ gas, and 5% $BCl_3$. The processing gas used in the eleventh experiment included 94% fluorine-containing gas, 1% $C_4F_8$, 2% $PF_3$ gas, and 3% $BCl_3$. The processing gas used in the twelfth experiment included 95% fluorine-containing gas, 1% $C_4F_8$, 2% $PF_3$ gas, and 2% $BCl_3$. The processing gas used in the thirteenth experiment included 96% fluorine-containing gas, 1% $C_4F_8$, 2% $PF_3$ gas, and 1% $BCl_3$. Other conditions for each of the fifth to thirteenth experiments are shown below.

<Other Conditions for Each of Fifth to Thirteenth Experiments>

Pressure of gas in the chamber 10: 27 mTorr (3.6 Pa)

Temperature of the substrate support 14: −70° C.

Figure 8:
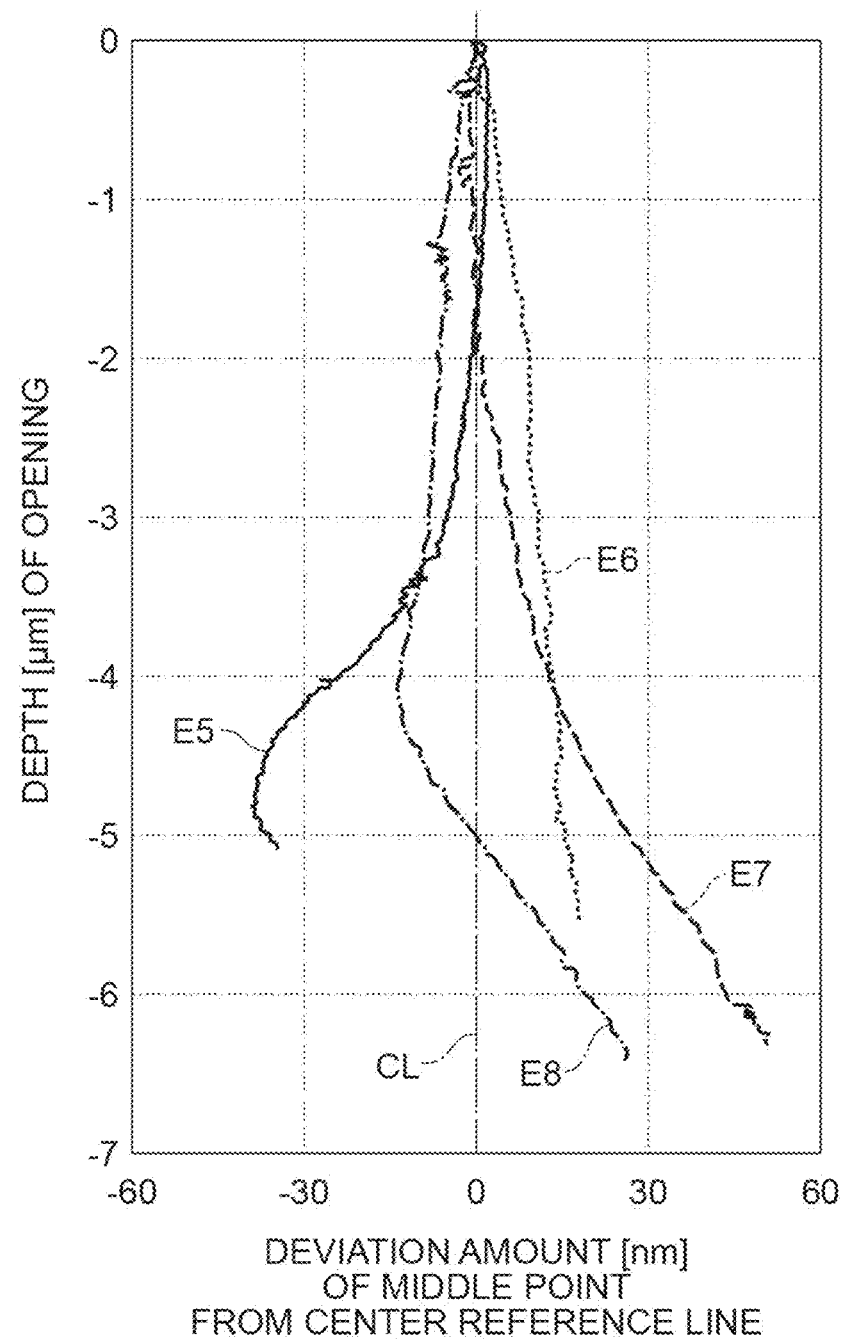
FIG. 8 is a graph showing the results of fifth to eighth exemplary experiments.
Figure 9:
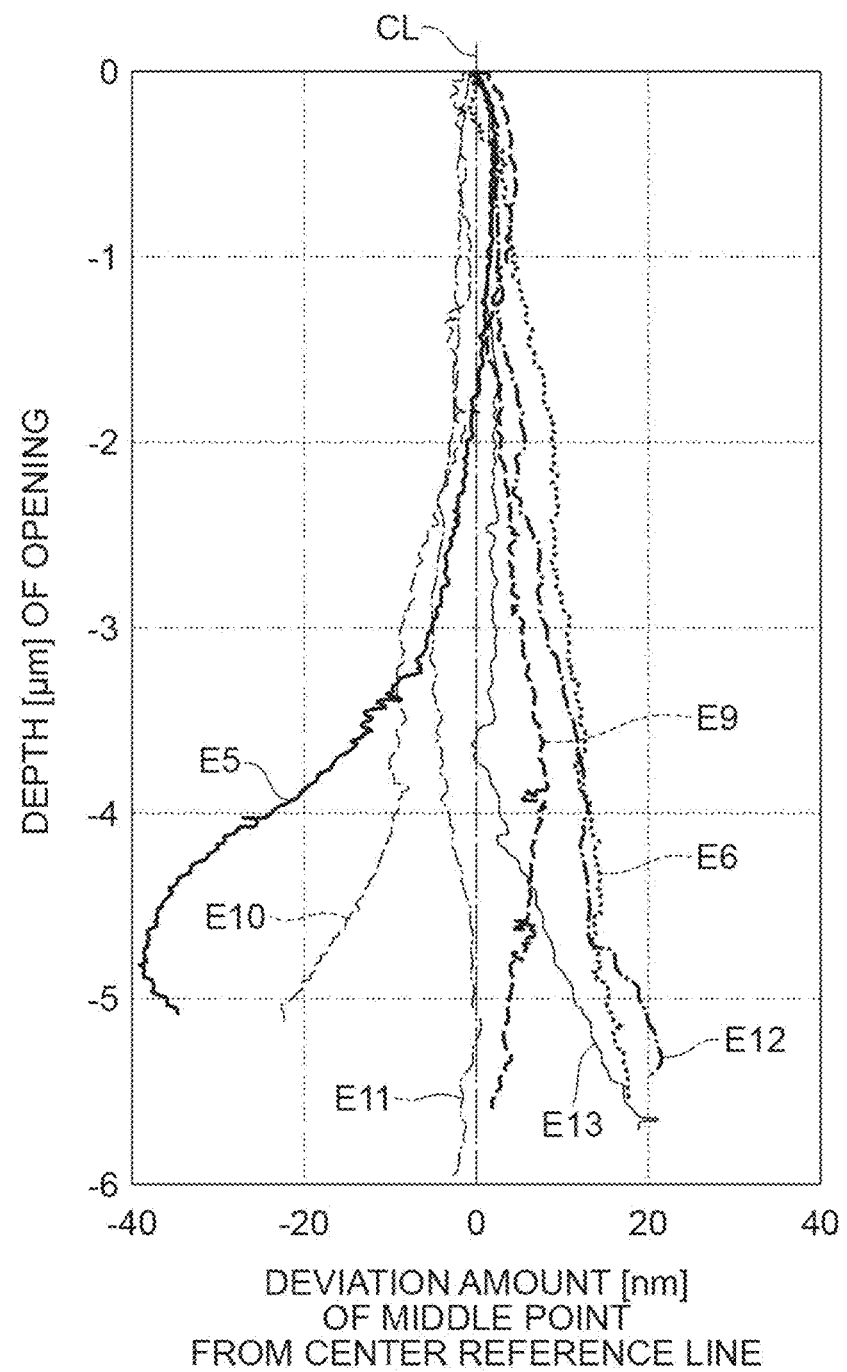
FIG. 9 is a graph showing the results of the fifth, sixth, and ninth to thirteenth exemplary experiments.

In each of the fifth to thirteenth experiments, after the etching of the silicon-containing film, the amount of deviation of the middle point MP of the width of the opening OP from the center reference line CL was determined as shown in FIG. 5. The results are shown in FIGS. 8 and 9. FIG. 8 is a graph showing the results of the fifth to eighth experiments. As shown in FIG. 8, the maximum deviation amount (18 nm) of a profile E6 indicating the amount of deviation of the middle point MP in the sixth experiment was smaller than the maximum deviation amount (38 nm) of a profile E5 indicating the amount of deviation of the middle point MP in the fifth experiment. Therefore, it was found that when $BCl_3$ was added to the processing gas, the degree of the defect of the shape of the opening OP was improved. On the other hand, the maximum deviation amount (51 nm) of a profile E7 indicating the amount of deviation of the middle point MP in the seventh experiment was larger than the maximum deviation amount (18 nm) of the profile E6 indicating the amount of deviation of the middle point MP in the sixth experiment. The maximum deviation amount (26 nm) of a profile E8 indicating the amount of deviation of the middle point MP in the eighth experiment was larger than the maximum deviation amount (18 nm) of the profile E6 indicating the amount of deviation of the middle point MP in the sixth experiment. The deviation width (18 nm) of the profile E6 indicating the amount of deviation of the middle point MP in the sixth experiment was smaller than the deviation width (about 40 nm) of the profile E8 indicating the amount of deviation of the middle point MP in the eighth experiment. The deviation width corresponds to the range in which the amount of deviation of each of the profiles E6 and E8 changes. Therefore, it was found that when $BCl_3$ was added to the processing gas, the degree of the defect of the shape of the opening OP was improved as compared with a case where $SiCl_4$ or $Cl_2$ was added to the processing gas.

FIG. 9 is a graph showing the results of the fifth, sixth, and ninth to thirteenth experiments. As shown in FIG. 9, the maximum deviation amount (8.2 nm) of a profile E9 indicating the amount of deviation of the middle point MP in the ninth experiment was smaller than the maximum deviation amount (18 nm) of the profile E6 indicating the amount of deviation of the middle point MP in the sixth experiment. $C_4F_8$ was added in order to adjust the defect of the shape of the opening OP. Even if $BCl_3$ is added after the adjustment of the defect of the shape by the addition of $C_4F_8$, the degree of the defect of the shape of the opening OP can be improved. Further, the maximum deviation amount (5.2 nm) of a profile E10 indicating the amount of deviation of the middle point MP in the tenth experiment was smaller than the maximum deviation amount (18 nm) of the profile E6 indicating the amount of deviation of the middle point MP in the sixth experiment. Therefore, it was found that even if the proportion of the flow rate of $BCl_3$ to the flow rate of the processing gas was as small as 1%, for example, the degree of the defect of the shape of the opening OP was improved.

(Fourteenth Experiment)

In the fourteenth experiment, a plurality of sample substrates were prepared. Each sample substrate had a silicon oxide film. In the fourteenth experiment, the silicon oxide film of the sample substrate was etched by generating plasma from the processing gas including $BCl_3$ by using the plasma processing apparatus 1. In the fourteenth experiment, the silicon oxide film of each sample substrate was etched with the proportion of the flow rate of BCl₃ to the flow rate of the processing gas set to 0%, 1%, 2%, 6%, or 13%. The temperature of the substrate support 14 was −70° C.

Figure 10:
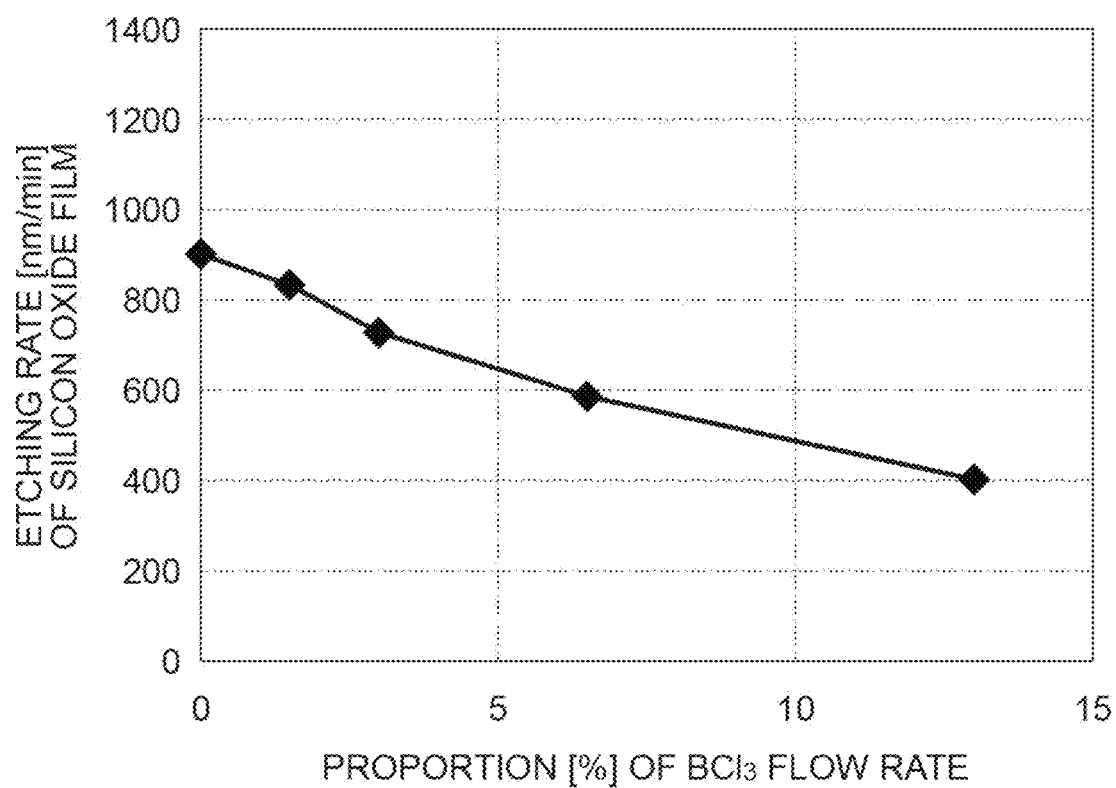
FIG. 10 is a graph showing the results of a fourteenth exemplary experiment.

In the fourteenth experiment, after the etching of the silicon oxide film, the etching rate of the silicon oxide film was determined. The results are shown in FIG. 10. FIG. 10 is a graph showing the results of the fourteenth experiment. As shown in FIG. 10, it was found that the etching rate of the silicon oxide film increased as the proportion of the BCl₃ flow rate decreased.

(Fifteenth Experiment)

In the fifteenth experiment, a plurality of sample substrates were prepared. Each sample substrate had a silicon nitride film. In the fifteenth experiment, the silicon nitride film of the sample substrate was etched by generating plasma from the processing gas including BCl₃ by using the plasma processing apparatus 1. In the fifteenth experiment, the silicon nitride film of each sample substrate was etched with the proportion of the flow rate of BCl₃ to the flow rate of the processing gas set to 0%, 1%, 2%, 6%, or 13%. The temperature of the substrate support 14 was −70° C.

Figure 11:
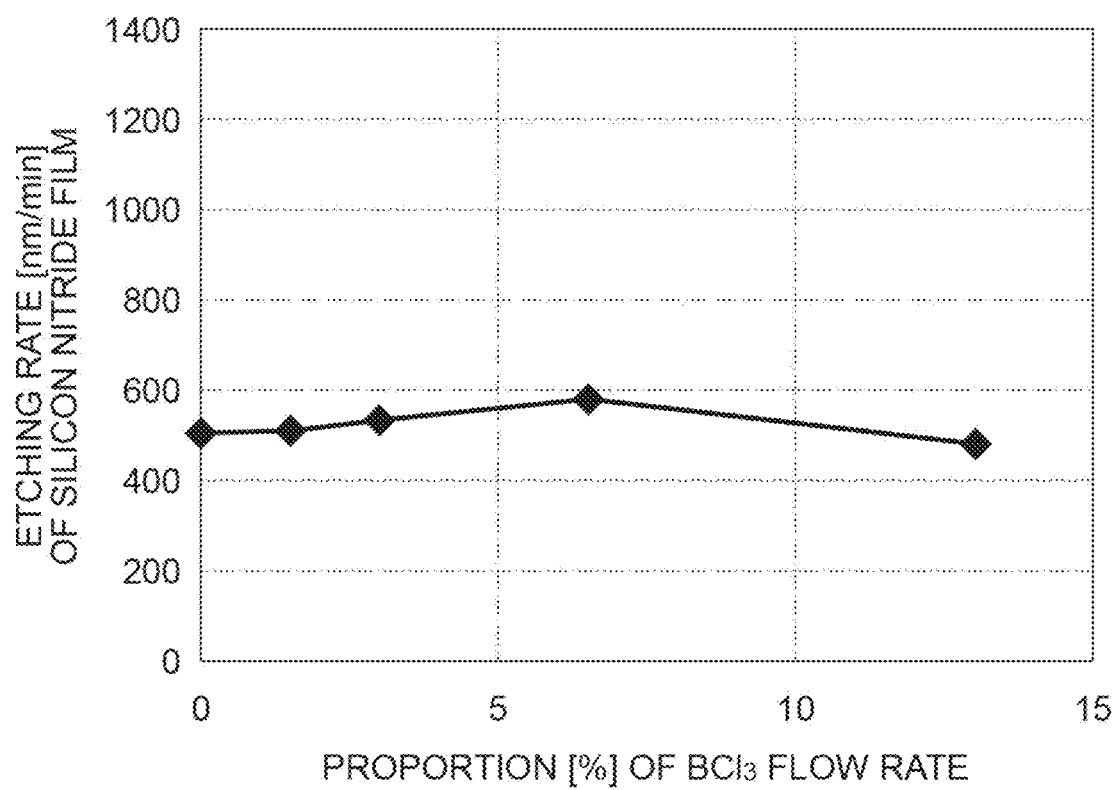
FIG. 11 is a graph showing the results of a fifteenth exemplary experiment.

In the fifteenth experiment, after the etching of the silicon nitride film, the etching rate of the silicon nitride film was determined. The results are shown in FIG. 11. FIG. 11 is a graph showing the results of the fifteenth experiment. As shown in FIG. 11, it was found that even if the proportion of the BCl₃ flow rate decreased, the etching rate of the silicon nitride film hardly changed.

(Sixteenth to Eighteenth Experiments)

In the sixteenth to eighteenth experiments, a plurality of sample substrates that are the same as the plurality of sample substrates prepared in the first to fourth experiments were prepared. In each of the sixteenth to eighteenth experiments, the silicon-containing film of the sample substrate was etched by generating plasma from the processing gas by using the plasma processing apparatus 1. The processing gas used in the sixteenth experiment included 8% Cl₂, 4% C₄F₈, and 88% other gas, and did not include BCl₃. The processing gas used in the seventeenth experiment included 8% Cl₂, 4% C₄F₈, 5% BCl₃, and 83% other gas. The processing gas used in the eighteenth experiment included 5% BCl₃, 5% C₄F₈, and 90% other gas, and did not include Cl₂. In the sixteenth to eighteenth experiments, the temperature of the substrate support 14 was −40° C.

Figure 12C:
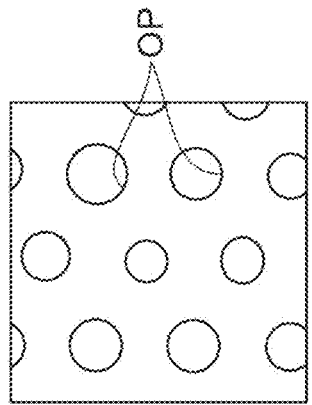
FIGS. 12A to 12C illustrate the results of sixteenth to eighteenth exemplary experiments, respectively.
Figure 12B:
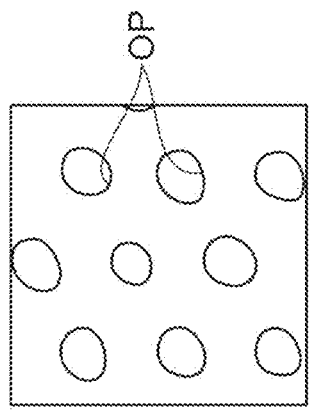
Figure 12A:
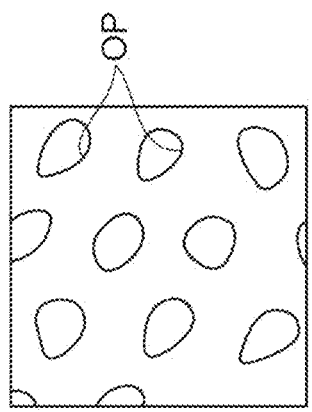

In each of the sixteenth to eighteenth experiments, the upper surface of the circular opening OP formed in the silicon-containing film SF by etching was observed. The results are shown in FIGS. 12A to 12C. FIGS. 12A to 12C are diagrams showing the results of the sixteenth to eighteenth experiments, respectively. As shown in FIGS. 12A to 12C, the roundness of the opening OP in the seventeenth experiment was improved as compared with the roundness of the opening OP in the sixteenth experiment. The roundness of the opening OP in the eighteenth experiment was improved as compared with the roundness of the opening OP in the seventeenth experiment. Therefore, it was found that when BCl₃ was added to the processing gas, the roundness was improved. Further, it was found that when the processing gas did not include Cl₂, the roundness was further improved.

According to an exemplary embodiment, it becomes possible to reduce a defect of the shape of an opening that is formed in the silicon-containing film in the plasma etching of the silicon-containing film.

From the above description, it will be understood that the various exemplary embodiments of the present disclosure are described in the present specification for purposes of explanation and that various modifications can be made without departing from the scope and gist of the present disclosure. Therefore, the various exemplary embodiments disclosed in the present specification are not intended to limit the present disclosure, and the true scope and gist are indicated by the appended claims.

What is claimed is:

1. An etching method comprising the steps of:
    (a) providing a substrate having a silicon-containing film including a silicon nitride film in a chamber; and
    (b) generating plasma from a processing gas in the chamber to etch the silicon-containing film, the processing gas including a phosphorous-containing gas, a fluorine-containing gas, and a boron-containing gas,
    wherein the phosphorous-containing gas includes at least one gas selected from the group consisting of phosphorous trichloride (PCl₃), phosphorous pentachloride (PCl₅), and phosphoryl chloride (POCl₃).

2. The etching method according to claim 1, wherein the step (b) includes setting a temperature of a substrate support supporting the substrate to a temperature of less than 0° C.

3. The etching method according to claim 1, wherein the fluorine- containing gas includes at least one fluorocarbon gas, hydrofluorocarbon gas, hydrogen fluoride gas, nitrogen trifluoride gas, and sulfur hexafluoride gas.

4. The etching method according to claim 1, wherein a proportion of a flow rate of the boron-containing gas to a flow rate of the processing gas is 6% or less.

5. The etching method according to claim 1, wherein the silicon-containing film further includes a silicon oxide film.

6. The etching method according to claim 1, wherein the boron-containing gas includes boron trichloride (BCl₃) gas.

7. The etching method according to claim 1, wherein the processing gas further includes a carbon-containing gas.

8. The etching method according to claim 1, wherein the processing gas further includes an oxygen-containing gas.

9. The etching method according to claim 1, wherein the substrate further has a mask on the silicon-containing film, the mask being formed of a carbon-containing material, a silicon-containing material or a metal-containing material.

10. The etching method according to claim 1, wherein the substrate further has a metal-containing mask on the silicon-containing film, the metal-containing mask containing titanium nitride, tungsten or tungsten carbide.

11. The etching method according to claim 1, wherein the phosphorous-containing gas includes phosphorous trichloride (PCl₃).

12. The etching method according to claim 1, wherein the phosphorous-containing gas includes phosphorous pentachloride (PCl₅).

13. The etching method according to claim 1, wherein the phosphorous-containing gas includes phosphoryl chloride (POCl₃).

14. An etching method comprising the steps of:
    (a) providing a substrate having a silicon-containing film including a silicon nitride film in a chamber; and
    (b) generating plasma from a processing gas in the chamber to etch the silicon-containing film, the processing gas including a phosphorous-containing gas, a fluorine-containing gas, and a boron-containing gas,
    wherein the fluorine-containing gas includes hydrogen fluoride gas.

15. The etching method according to claim 14,
wherein the step (b) includes setting a temperature of a substrate support supporting the substrate to a temperature of less than 0° C.,
wherein the fluorine-containing gas includes at least one of fluorocarbon gas, hydrofluorocarbon gas, hydrogen fluoride gas, nitrogen trifluoride gas, and sulfur hexafluoride gas,
wherein a proportion of a flow rate of the boron-containing gas to a flow rate of the processing gas is 6% or less, and
wherein the silicon-containing film further includes a silicon oxide film.

16. The etching method of claim 14,
wherein the boron-containing gas includes boron trichloride ($BCl_3$) gas,
wherein the processing gas further includes a carbon-containing gas,
wherein the processing gas further includes an oxygen-containing gas,
wherein the substrate further has a mask on the silicon-containing film, the mask being formed of a carbon-containing material, a silicon-containing material or a metal-containing material, and
wherein the substrate further has a metal-containing mask on the silicon-containing film, the metal-containing mask containing titanium nitride, tungsten or tungsten carbide.

17. The etching method of claim 14,
wherein the phosphorous-containing gas includes at least one gas selected from the group consisting of phosphorous trifluoride ($PF_3$), phosphorous trichloride ($PCl_3$), phosphorous pentachloride ($PCl_5$), and phosphoryl chloride ($POCl_3$).

* * * * *